United States Patent
Kim et al.

(10) Patent No.: US 11,488,667 B2
(45) Date of Patent: Nov. 1, 2022

(54) SEMICONDUCTOR DEVICE

(71) Applicant: SK hynix Inc., Icheon-si (KR)

(72) Inventors: Jin Ho Kim, Icheon-si (KR); Sang Hyun Sung, Icheon-si (KR); Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 240 days.

(21) Appl. No.: 17/030,266

(22) Filed: Sep. 23, 2020

(65) Prior Publication Data

US 2021/0272631 A1 Sep. 2, 2021

(30) Foreign Application Priority Data

Mar. 2, 2020 (KR) .................. 10-2020-0025960

(51) Int. Cl.
| | |
|---|---|
| *G11C 16/24* | (2006.01) |
| *G11C 16/04* | (2006.01) |
| *G11C 16/08* | (2006.01) |
| *G11C 16/10* | (2006.01) |
| *H01L 27/115* | (2017.01) |
| *G11C 16/26* | (2006.01) |
| *G11C 16/14* | (2006.01) |

(52) U.S. Cl.
CPC .......... *G11C 16/0483* (2013.01); *G11C 16/08* (2013.01); *G11C 16/10* (2013.01); *G11C 16/14* (2013.01); *G11C 16/26* (2013.01); *H01L 27/115* (2013.01)

(58) Field of Classification Search
CPC ..................................................... G11C 16/24
USPC ..................................................... 365/185.12
See application file for complete search history.

(56) References Cited

U.S. PATENT DOCUMENTS

| | | | |
|---|---|---|---|
| 9,142,297 B2 | 9/2015 | Kim et al. | |
| 2016/0093384 A1* | 3/2016 | Lee ........... | G11C 16/24 365/185.12 |
| 2019/0043872 A1 | 2/2019 | Oh et al. | |

* cited by examiner

*Primary Examiner* — Jason Lappas (57) ABSTRACT

A semiconductor device having a three-dimensional (3D) structure is disclosed. The semiconductor device includes a first substrate layer including a logic circuit, and a plurality of second substrate layers stacked on the first substrate layer, the plurality of second substrate layers including a memory cell array. Each of the plurality of second substrate layers includes, a transfer circuit, coupled to a row line of the memory cell array, that is disposed over the second substrate layer and selectively coupled to a global row line.

22 Claims, 10 Drawing Sheets

SEMICONDUCTOR DEVICE

CROSS-REFERENCE TO RELATED APPLICATION

This patent document claims priority and the benefits of Korean patent application No. 10-2020-0025960, filed on Mar. 2, 2020, which is hereby incorporated in its entirety by reference.

TECHNICAL FIELD

The technology and implementations disclosed herein generally relate to a semiconductor device, and more particularly to a semiconductor device having a three-dimensional (3D) structure.

BACKGROUND

In recent times, demand for higher-integration semiconductor devices has been increasing in order to satisfy consumer demands for superior performance and lower costs. Since the integration degree of two-dimensional (2D) or one-dimensional (1D) semiconductor devices is mainly determined by a region or an area occupied by a unit memory cell, the integration degree of 2D or 1D semiconductor devices is greatly affected by technology of forming fine patterns. However, ultra-high-cost devices are generally needed for higher degrees of pattern miniaturization (i.e., finer patterns). Therefore, whereas the integration degree of 2D semiconductor devices is rapidly increasing, the application range of such 2D semiconductor devices is still limited due to cost. As an alternative to overcome the above-mentioned limitations, three-dimensional (3D) semiconductor devices, in which memory cells are arranged in a three-dimensional (3D) structure, have recently been developed and have rapidly come into widespread use.

SUMMARY

Various embodiments of the disclosed technology relate to a semiconductor device that includes a plurality of substrate layers and allows a plurality of pass transistors to be distributed to the different substrate layers, such that the number of pass transistors is reduced irrespective of the increasing number of stacks.

In accordance with an embodiment of the disclosed technology, a semiconductor device may include a first substrate layer including a logic circuit, and a plurality of second substrate layers stacked on the first substrate layer, the plurality of second substrate layers including a memory cell array. Each of the plurality of second substrate layers may include a transfer circuit, coupled to a row line of the memory cell array, that is disposed over the second substrate layer and selectively coupled to a global row line.

In accordance with another embodiment of the disclosed technology, a semiconductor device may include a first substrate layer including a logic circuit, a plurality of second substrate layers, stacked on the first substrate layer, each including, a first sub-cell array and a first pass transistor group, and a third substrate layer, stacked on the plurality of second substrate layers, including a second sub-cell array and a second pass transistor group.

It is to be understood that both the foregoing general description, and the following detailed description, of the technology disclosed herein are illustrative and explanatory and intended to provide further explanation of the scope of the disclosure to those skilled in the art.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of a semiconductor device that substantially addresses one or more issues related to limitations or disadvantages of the related art. Some implementations of the disclosed technology suggest a semiconductor device that includes a plurality of substrate layers and allows a plurality of pass transistors to be distributed to the different substrate layers, such that a size of the semiconductor device is reduced irrespective of the increasing number of stacks. In recognition of the issues above, the disclosed technology provides various implementations of a semiconductor device which reduces the number of pass transistors irrespective of the increasing number of stacks, such that performance in high-speed operations can be improved.

Reference will now be made in detail to aspects of the disclosed technology, embodiments and examples of which are illustrated in the accompanying drawings. Wherever possible, the same reference numbers are used throughout the drawings to refer to the same or like portions.

In association with the embodiments of the disclosed technology, specific structural and functional descriptions are disclosed only for illustrative purposes. The embodiments represent a limited number of possible embodiments. However, embodiments of the disclosed technology can be implemented in various and different ways without departing from the scope or spirit of the disclosed technology.

In describing the disclosed technology, the terms "first" and "second" may be used to describe multiple components, but the components are not limited by the terms in number or order. The terms may be used to distinguish one component from another component. For example, a first component may be called a second component and a second component may be called a first component without departing from the scope of the disclosure.

The terms used in the present application are merely used to describe specific embodiments and are not intended to limit the disclosed technology. A singular expression may include a plural expression unless explicitly stated otherwise.

Unless otherwise defined, all terms used herein, including technical or scientific terms, have the same meanings as understood by those skilled in the art. Terms defined in a generally used dictionary may be analyzed to have the same meaning as the context of the relevant art and should not be analyzed to have an ideal meaning or an excessively formal meaning unless clearly defined in the present application. The terminology used in the disclosed technology is for the purpose of describing particular embodiments only and is not intended to limit the disclosure.

Figure 1:
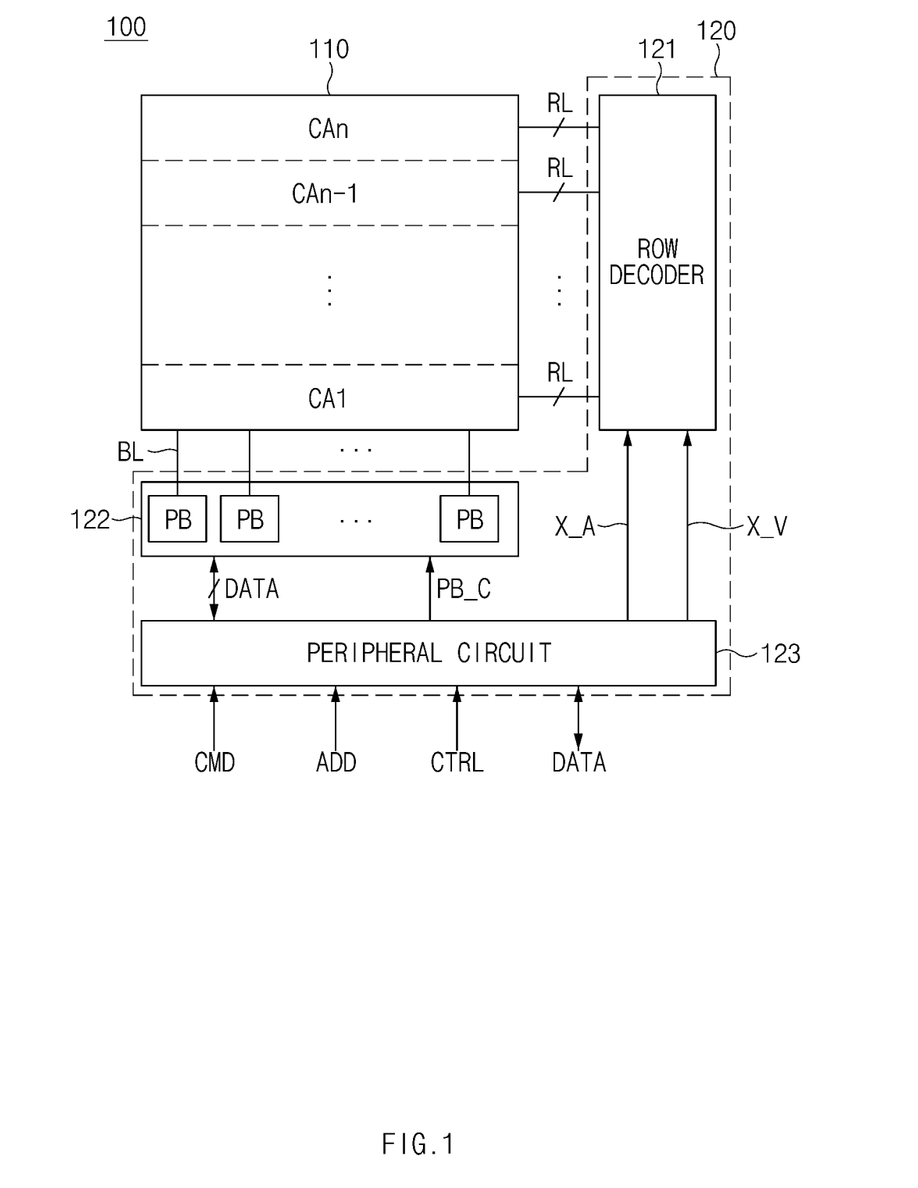
FIG. 1 is a block diagram illustrating a semiconductor device in accordance with an embodiment of the disclosure.

FIG. 1 is a block diagram illustrating a semiconductor device in accordance with an embodiment of the disclosure.

Referring to FIG. 1, the semiconductor device 100 may include a memory cell array 110 and a logic circuit 120. The logic circuit 120 may include a row decoder 121, a page buffer 122, and a peripheral circuit 123.

The memory cell array 110 may include a plurality of sub-cell arrays CA1~CAn. Although not shown in FIG. 1, each of the sub-cell arrays CA1~CAn may include a plurality of cell strings.

Each of the cell strings may include at least one drain selection transistor, a plurality of memory cells, and at least one source selection transistor that are coupled in series to one another. A memory cell may be a volatile memory cell or a non-volatile memory cell. Although the semiconductor device 100 is implemented as a vertical NAND flash device for convenience of description, the scope or spirit of the disclosed technology is not limited thereto and other volatile or nonvolatile memory devices are contemplated by the disclosed technology.

The memory cell array 110 may be coupled to the row decoder 121 through a plurality of row lines (RL). The row lines (RL) may include at least one drain selection line, a plurality of word lines, and at least one source selection line. The memory cell array 110 may be coupled to the page buffer circuit 122 through a plurality of bit lines (BL).

The row decoder 121 may select any one of the sub-cell arrays CA1~CAn contained in the memory cell array 110 upon receiving a row address (X_A) from the peripheral circuit 123. The row decoder 121 may transmit an operation voltage (X_V), received from the peripheral circuit 123, to the plurality of row lines (RL) coupled to the sub-cell arrays CA1~CAn contained in the memory cell array 110.

The page buffer circuit 122 may include a plurality of page buffers (PB) respectively coupled to the plurality of bit lines (BL). The page buffer circuit 122 may receive a page buffer control signal (PB_C) from the peripheral circuit 123. The page buffer circuit 122 may transmit and receive data (DATA) to and from the peripheral circuit 123. The page buffer circuit 122 may control the plurality of bit lines (BL) arranged in the memory cell array 110 in response to a page buffer control signal (PB_C).

For example, the page buffer circuit 122 may detect a signal of any bit line (BL) of the memory cell array 110 in response to the page buffer control signal (PB_C), such that the page buffer circuit 122 detects data stored in any memory cell of the memory cell array 110 and transmits data (DATA) to the peripheral circuit 123 in response to the detected data. The page buffer circuit 122 may transmit a signal to the bit line (BL) based on the data (DATA) received from the peripheral circuit 123 in response to the page buffer control signal (PB_C), such that the page buffer circuit 122 may write data in the memory cell of the memory cell array 110.

The page buffer circuit 122 may write data in a memory cell coupled to an activated word line, or may read out data from the memory cell.

The peripheral circuit 123 may receive a command (CMD), an address (ADD), and a control signal (CTRL), and may transmit and receive data (DATA) to and from an external device (e.g., a memory controller) of the semiconductor device 100. The peripheral circuit 123 may write data in the memory cell array 110 based on the command (CMD), the address (ADD), and the control signal (CTRL). The peripheral circuit 123 may output signals (e.g., the row address (X_A), the page buffer control signal (PB_C), etc.) for reading output data from the memory cell array 110. The peripheral circuit 123 may generate not only the operation voltage (X_V), but also various voltages requested or required by the semiconductor device 100.

For convenience of description, two directions that are arranged to cross each other while being parallel to a top surface of a substrate will hereinafter be defined as a first direction (FD) and a second direction (SD), and another direction vertically protruding from the top surface of the substrate will hereinafter be defined as a third direction (TD).

For example, the first direction (FD) may correspond to an extension direction of the row line (word line), and the second direction (SD) may correspond to an extension direction of the bit line. The first direction (FD) and the second direction (SD) may be substantially perpendicular to each other. The third direction (TD) may correspond to one direction perpendicular to each of the first direction (FD) and the second direction (SD). In the following description, the term "vertical" or "vertical direction" may be substantially identical to the third direction (TD) for convenience of description. In the drawings, the direction denoted by arrows and the other direction opposite to the arrow direction will hereinafter be substantially identical to each other.

Figure 2:
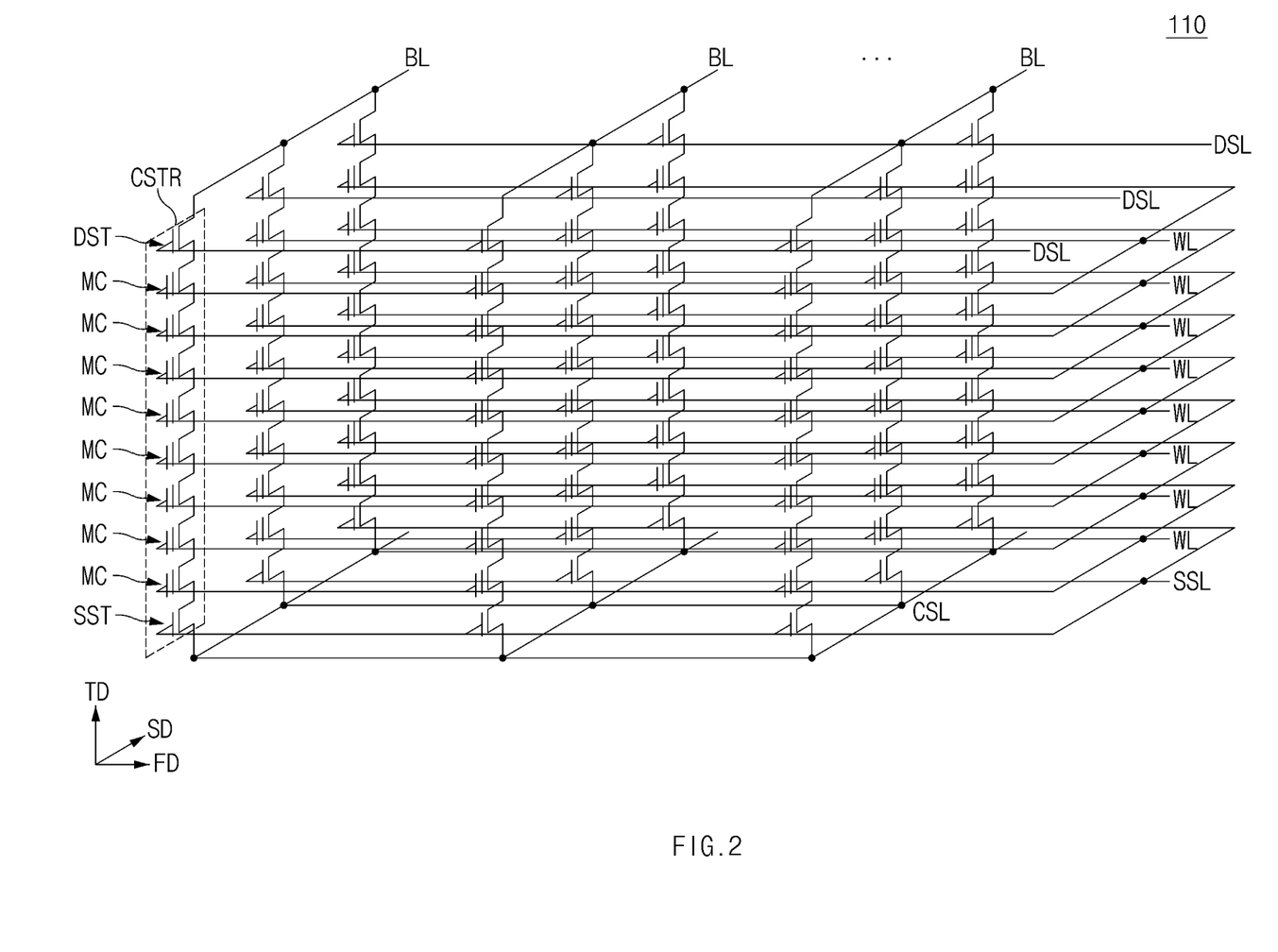
FIG. 2 is a schematic diagram illustrating a single equivalent circuit of a memory cell array shown in FIG. 1 in accordance with an embodiment of the disclosure.

FIG. 2 is a schematic diagram illustrating a single equivalent circuit of the memory cell array 110 shown in FIG. 1 in accordance with an embodiment of the disclosure.

Referring to FIG. 2, the memory cell array 110 may include a plurality of cell strings (CSTR) coupled between a common source line (CSL) and the plurality of bit lines (BL).

The bit lines (BL) may extend in the second direction (SD), and may be arranged in the first direction (FD). The plurality of cell strings (CSTR) may be coupled in parallel to the plurality of bit lines (BL). The plurality of cell strings (CSTR) may be commonly coupled to the common source line (CSL). The plurality of cell strings (CSTR) may be disposed between a single common source line (CSL) and the plurality of bit lines (BL).

Each cell string (CSTR) may include a drain selection transistor (DST) coupled to the bit line (BL), a source selection transistor (SST) coupled to the common source line (CSL), and a plurality of memory cells (MC) coupled between the drain selection transistor (DST) and the source selection transistor (SST). The drain selection transistor (DST), the plurality of memory cells (MC), and the source selection transistor (SST) may be coupled in series to one another in the third direction (TD).

The plurality of drain selection lines (DSL), the plurality of word lines (WL), and the source selection line (SSL) may be arranged between the common source line (CSL) and the plurality of bit lines (BL). The drain selection lines (DSL) may be respectively coupled to gates of the drain selection transistors (DST) respectively corresponding to the drain selection lines (DSL). The word lines (WL) may be coupled to gates of the memory cells (MC) respectively corresponding to the word lines (WL). The source selection line (SSL) may be coupled to gates of the source selection transistors (SST). The plurality of memory cells (MC) commonly coupled to the single word line (WL) may construct a single page.

Figure 3:
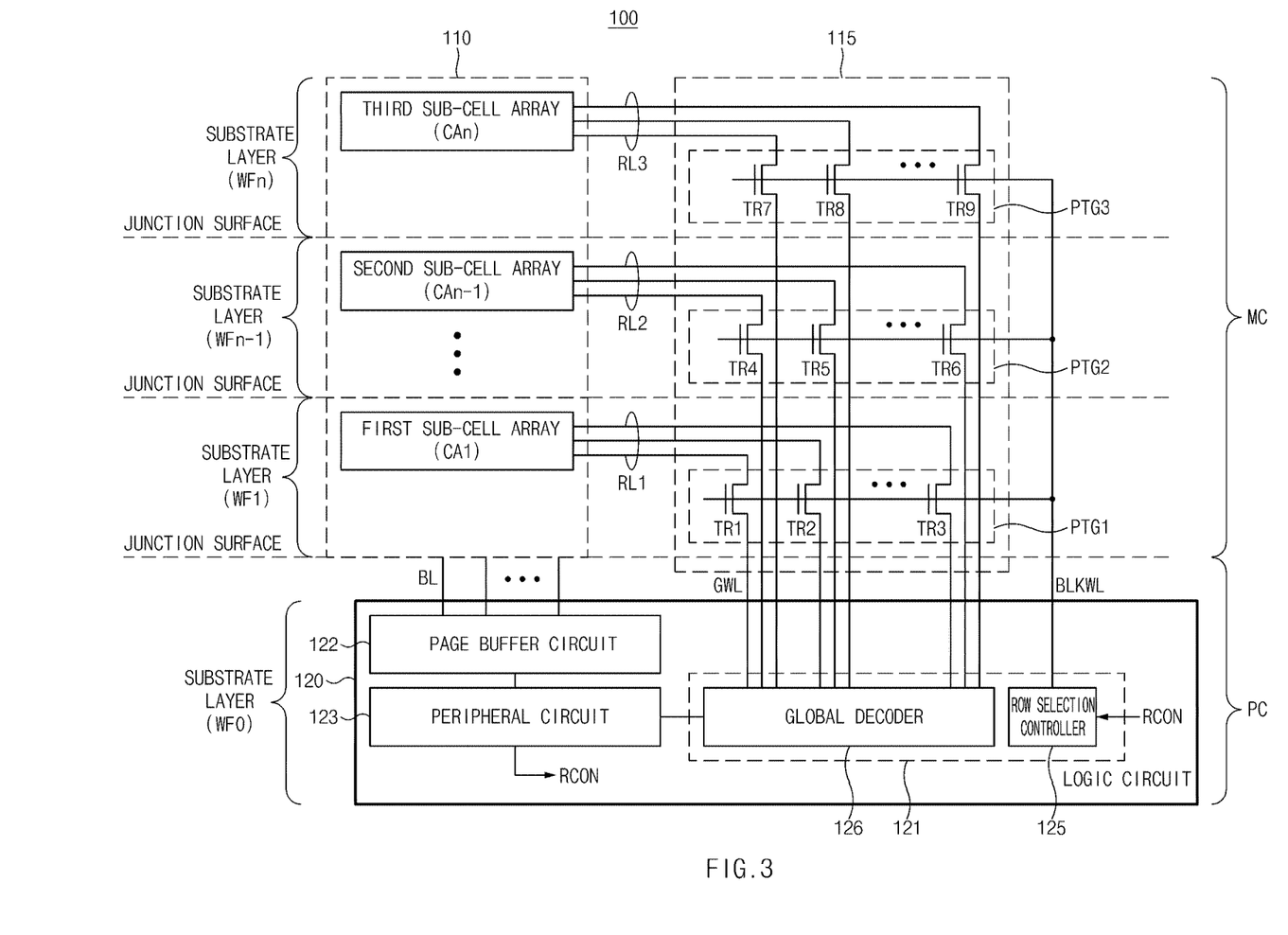
FIG. 3 is a block diagram illustrating a semiconductor device in accordance with an embodiment of the disclosure.

FIG. 3 is a block diagram illustrating a semiconductor device in accordance with an embodiment of the disclosure.

Referring to FIG. 3, a semiconductor device 100 may include a memory chip MC and a circuit chip PC. In FIG. 3, the semiconductor device 100 may include a stacked structure in which the memory chip MC is stacked on the circuit chip PC.

The memory chip MC may include a memory cell array 110 and a transfer circuit 115. The memory chip MC may include a plurality of stacked substrate layers WF1~WFn, and the respective substrate layers WF1~WFn may be coupled to each other through junction surfaces between substrate layers. The memory chip MC may include the memory cell array 110 formed and distributed in the substrate layers WF1~WFn.

In more detail, the memory cell array 110 may be formed by sequentially stacking a first sub-cell array CA1, a second sub-cell array CAn-1, and a third sub-cell array CAn in different substrate layers. For example, the first sub-cell array CA1 may be formed in the substrate layer WF1. The second sub-cell array CAn-1 may be formed in the substrate layer WFn-1. The third sub-cell array CAn may be formed in the substrate layer WFn.

The semiconductor device 100 may include the transfer circuit 115 disposed over the memory chip MC. The transfer circuit 115 may be coupled to the memory cell array 110 through a plurality of row lines RL1~RL3. The transfer circuit 115 may include a plurality of pass transistor groups PTG1~PTG3, each of which provides a high voltage received from a global row line (GWL) to the memory cell array 110.

The pass transistor groups PTG1~PTG3 may be disposed to correspond to the first sub-cell array (CA1), the second sub-cell array (CAn-1), and the third sub-cell array (CAn) on a one-to-one basis. That is, the pass transistor groups PTG1~PTG3, respectively matched to the row lines RL1~RL3, may also respectively correspond to the substrate layers WF1~WFn such that the pass transistor groups PTG1~PTG3 can be distributed to match the substrate layers WF1~WFn in a distributed manner.

For example, the pass transistor group PTG1 may be formed in substrate layer WF1, which includes the first sub-cell array CA1. The pass transistor group PTG2 may be formed in substrate layer WFn-1, which includes the second sub-cell array CAn-1. In addition, the pass transistor group PTG3 may be formed in substrate layer WFn, which includes the third cell array CAn.

The pass transistor groups PTG1~PTG3 may be disposed to correspond to the substrate layers WF1~WFn on a one-to-one basis. Therefore, the row lines RL1~RL3 may be respectively disposed in the substrate layers WF1~WFn.

The pass transistor group PTG1 may include a plurality of pass transistors TR1~TR3 configured to selectively couple the row line RL1 of the first sub-cell array CA1 to the global row line (GWL). The pass transistor group PTG1 may include the same number of pass transistors TR1~TR3 as the number of row sub-lines in row line (RL1). The pass transistors TR1~TR3 may be coupled between the row line RL1 of the first sub-cell array CA1 and the global row line (GWL), such that each of the pass transistors TR1~TR3 may receive a row selection signal (BLKWL) through its gate terminal.

The pass transistor group PTG2 may include a plurality of pass transistors TR4~TR6 configured to selectively couple the row line RL2 of the second sub-cell array CAn-1 to the global row line (GWL). The pass transistor group PTG2 may include the same number of pass transistors TR4~TR6 as the number of row sub-lines in row line (RL2). The pass transistors TR4~TR6 may be coupled between the row line RL2 of the second sub-cell array CAn-1 and the global row line (GWL), such that each of the pass transistors TR4~TR6 may receive a row selection signal (BLKWL) through its gate terminal.

The pass transistor group PTG3 may include a plurality of pass transistors TR7~TR9 configured to selectively couple the row line RL3 of the third sub-cell array CAn to the global row line (GWL). The pass transistor group PTG3 may include the same number of pass transistors TR7~TR9 as the number of row sub-lines in row line (RL3). The pass transistors TR7~TR9 may be coupled between the row line RL3 of the third sub-cell array CAn and the global row line (GWL), such that each of the pass transistors TR7~TR9 may receive the row selection signal BLKWL through its gate terminal.

The circuit chip PC may include a logic circuit 120 contained in the substrate layer WF0. As previously stated in FIG. 1, the logic circuit 120 may include a row decoder 121, a page buffer circuit 122, and a peripheral circuit 123.

The row decoder 121 may include a row selection controller 125 and a global decoder 126. In some embodiments, the row selection controller 125 and the global decoder 126 may be commonly provided in the memory cell array 110.

The row selection controller 125 may transmit a row selection signal (BLKWL) to each of the pass transistors TR1~TR9 of the transfer circuit 115. Upon receiving a row control signal (RCON) from the peripheral circuit 123, the row selection controller 125 may transmit the row selection signal (BLKWL) for selecting the memory cell array 110 to the pass transistors TR1~TR9.

The global decoder 126 may be coupled to the transfer circuit 115 through the plurality of global row lines (GWL). The global decoder 126 may transmit an operation voltage received from the peripheral circuit 123 to the transfer circuit 115 through the plurality of global row lines (GWL).

The greater the number of stacks contained in the semiconductor device 100, the greater the number of pass transistors. As a result, as the number of stacks increases, the region occupied by the row decoder may increase in size, and performance may be deteriorated in a high-speed operation mode.

Therefore, stacks of the memory cell array 110 may be classified according to the substrate layers WF1~WFn, and the transfer circuits 115 may be distributed to the substrate layers WF1~WFn so that the transfer circuits 115 may correspond to the substrate layers WF1~WFn. Semiconductor devices according to embodiments of the disclosed technology can reduce the size of the region occupied by the row decoder in response to an increasing number of stacks, and can improve uniformity of a row line (RL) interface through a distributed structure. In addition, the semiconductor devices may be designed to maintain the pitch of bit lines, and need not include a plurality of pass transistors in the circuit chip PC, such that logic circuits can be easily designed.

Figure 4:
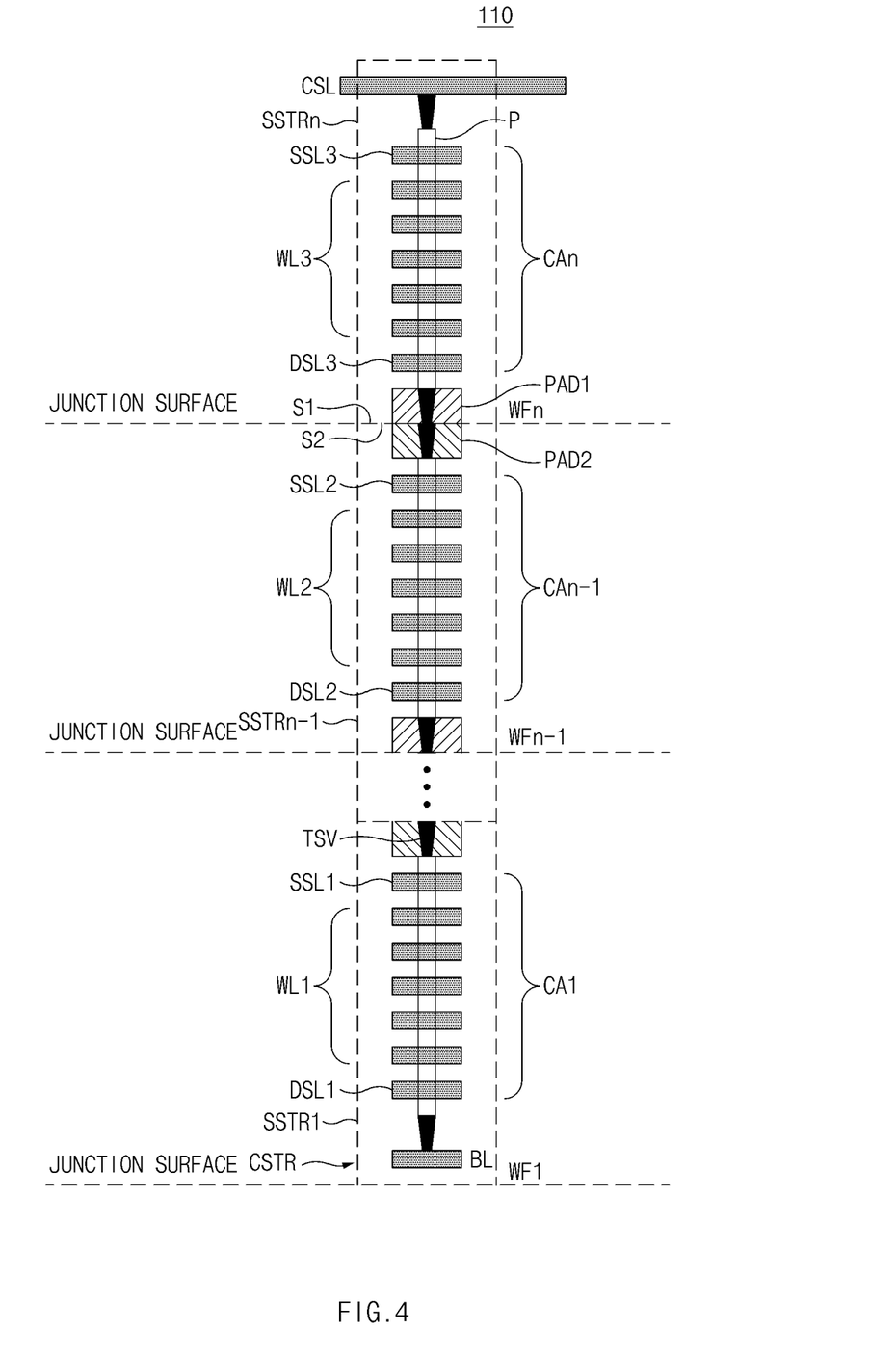
FIG. 4 is a detailed schematic diagram illustrating an example of a memory cell array of FIG. 3 in accordance with an embodiment of the disclosure.

FIG. 4 is a detailed schematic diagram illustrating an example of the memory cell array of FIG. 3 in accordance with an embodiment of the disclosure.

Referring to FIG. 4, the memory cell array 110 may include a cell string (CSTR) with sub-cell strings SSTR1~SSTRn respectively corresponding to the substrate layers WF1~WFn. In other words, the substrate layers WF1~WFn may be coupled to one cell string (CSTR). The sub-cell string SSTR1 may correspond to the first sub-cell array CA1. The sub-cell string SSTRn-1 may correspond to the second sub-cell array CAn-1. The sub-cell string SSTRn may correspond to the third sub-cell array CAn.

The cell string (CSTR) may include the sub-cell strings SSTR1~SSTRn coupled to each other through at least one pad (PAD) at junction surfaces of the respective substrate layer WF1~WFn. For example, each of the substrate layers WF1~WFn may be configured in a manner such that a silicon substrate is bonded to the pad (PAD) at the junction surfaces of the substrate layers WF1~WFn.

The cell strings (CSTR) may enable the sub-cell strings SSTR1~SSTRn to be electrically coupled to each other through a through silicon via (TSV) formed to penetrate the substrate layers WF1~WFn. A first pad PAD1 may be disposed over the first surface S1 of each substrate layer WF1~WFn. A second pad PAD2 corresponding to the first pad PAD1 may be disposed over the second surface S2 of each substrate layer WF1~WFn.

The first pad PAD1 and the second pad PAD2 corresponding to the first pad PAD1 may have substantially the same size, and may be arranged symmetrical to each other. The first pad PAD1 and the second pad PAD2 may have a mirrored symmetrical structure based on a junction surface interposed. The second surface S2 may be bonded to the first surface S1 corresponding thereto, such that the first pad PAD1 can be coupled to the second pad PAD2 corresponding thereto.

Each of the first pad PAD1 and the second pad PAD2 may be formed to allow the through silicon via (TSV) to pass. The through silicon vias (TSV) may be coupled to a vertical channel P. One cell string (CSTR) may allow the common source line (CSL) to be electrically coupled to the bit line (BL) through the vertical channels P and the through silicon vias (TSV).

Cell string (CSTR) may include a plurality of source selection lines SSL1~SSL3, a plurality of word lines WL1~WL3, and a plurality of drain selection lines DSL1~DSL3 disposed between the single common source line (CSL) and a single bit line (BL). The cell string (CSTR) may be configured in a manner such that the common source line (CSL), the source selection lines SSL1~SSL3, the word lines WL1~WL3, the drain selection lines DSL1~DSL3, and the bit line are disposed along the vertical channels P.

That is, a predetermined number of source selection lines SSL1~SSL3, a predetermined number of word lines WL1~WL3, a predetermined number of drain selection lines DSL1~DSL3 in the cell string (CSTR) may be formed in each of the substrate layers WF1~WFn. In the cell string (CSTR), the source selection lines SSL1~SSL3, the word lines WL1~WL3, and the drain selection lines DSL1~DSL3 may be isolated from one another in units of the substrate layers WF1~WFn.

For example, the sub-cell array CA1 formed in the substrate layer WF1 may include the source selection line SSL1, the plurality of word lines (WL1), and the drain selection line (DSL1). The sub-cell array CAn-1 formed in the substrate layer WFn-1 may include the source selection line SSL2, the plurality of word lines (WL2), and the drain selection line (DSL2). In addition, the sub-cell array CAn formed in the substrate layer WFn may include the source selection line SSL3, the plurality of word lines (WL3), and the drain selection line (DSL3).

If the transfer circuit 115 is turned on in response to the row selection line (BLKWL), then the memory cell array 110 may enable the plurality of word lines WL1~WL3 to be activated so that a read operation or a program operation can be carried out. During the read operation or the program operation, the source selection lines SSL1~SSL3 and the drain selection lines DSL1~DSL3 of the sub-cell arrays CA1~CAn of the cell string (CSTR) may remain activated. Therefore, channels of the substrate layers WF1~WFn can be electrically coupled to each other.

In contrast, during an erase operation of the memory cell array 110, the source selection lines SSL1~SSL3 and the drain selection lines DSL1~DSL3 of the sub-cell arrays CA1~CAn can be controlled independently from each other. During the erase operation of the memory cell array 110, an erase bias voltage may be independently applied to the source selection lines SSL1~SSL3 and the drain selection lines DSL1~DSL3 of the substrate layers WF1~WFn. That is, the erase bias voltage may be applied to the source selection line SSL1 and the drain selection line DSL1 of the substrate layer WF1, may be applied to the source selection line SSL2 and the drain selection line DSL2 of the substrate layer WFn-1, and may also be applied to source selection line SSL3 and the drain selection line DSL3 of the substrate layer WFn.

Semiconductor devices according to embodiments of the disclosed technology may allow channels to be isolated from each other according to the respective substrate layers such as WF1~WFn, so that the erase operations of the sub-cell arrays such as CA1~CAn respectively associated with the sub-cell strings such as SSTR1~SSTRn can be controlled separately from each other. In other words, cell string (CSTR) is characterized as being contained in a single block, and a plurality of sub-cell strings such as SSTR1~SSTRn can be classified according to sub blocks. As a result, erase operations can be controlled in units of a sub block within a single block.

Figure 5:
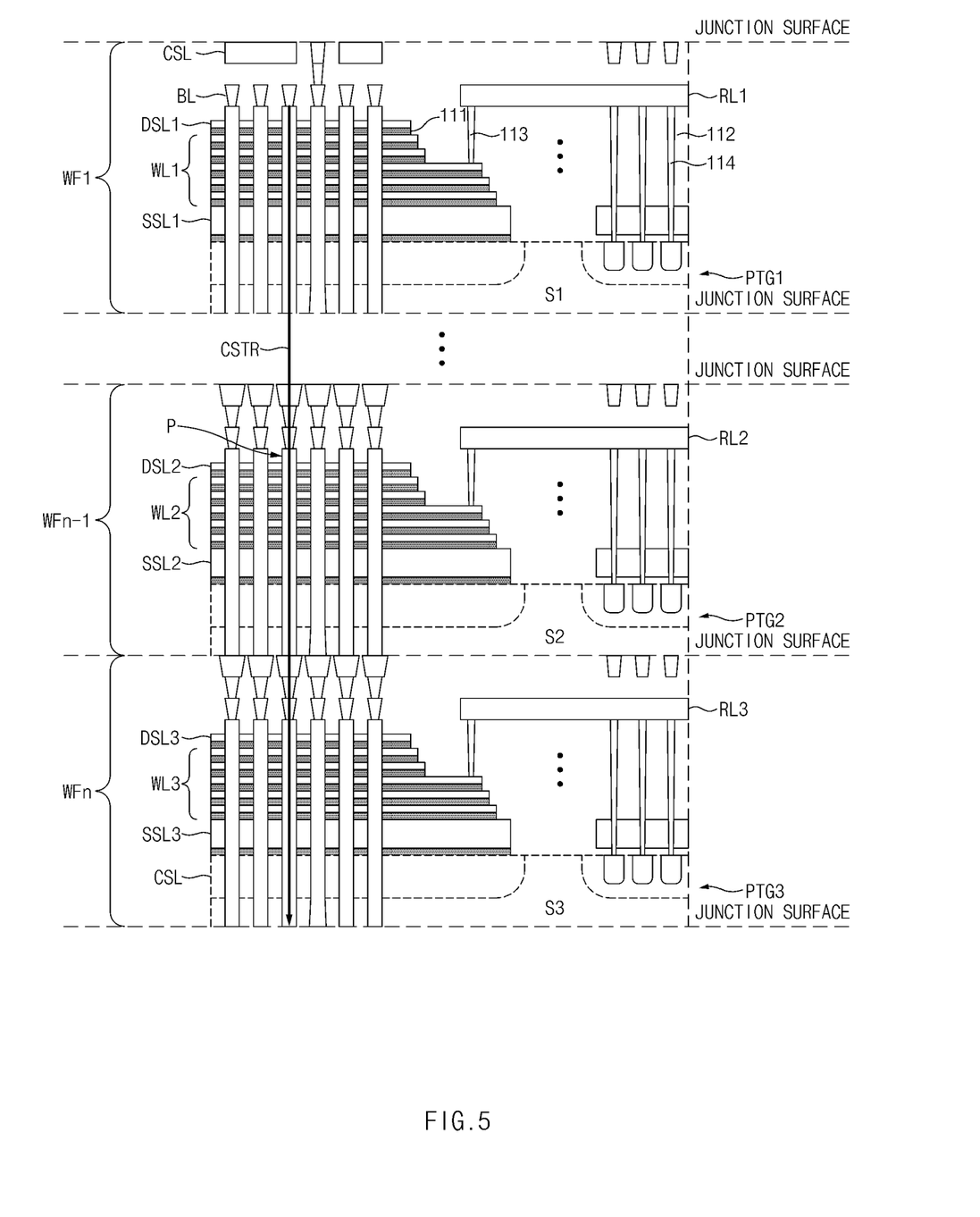
FIGS. 5 and 6 are cross-sectional views illustrating examples of substrate layers illustrated in FIGS. 3 and 4 in accordance with embodiments of the disclosure.
Figure 6:
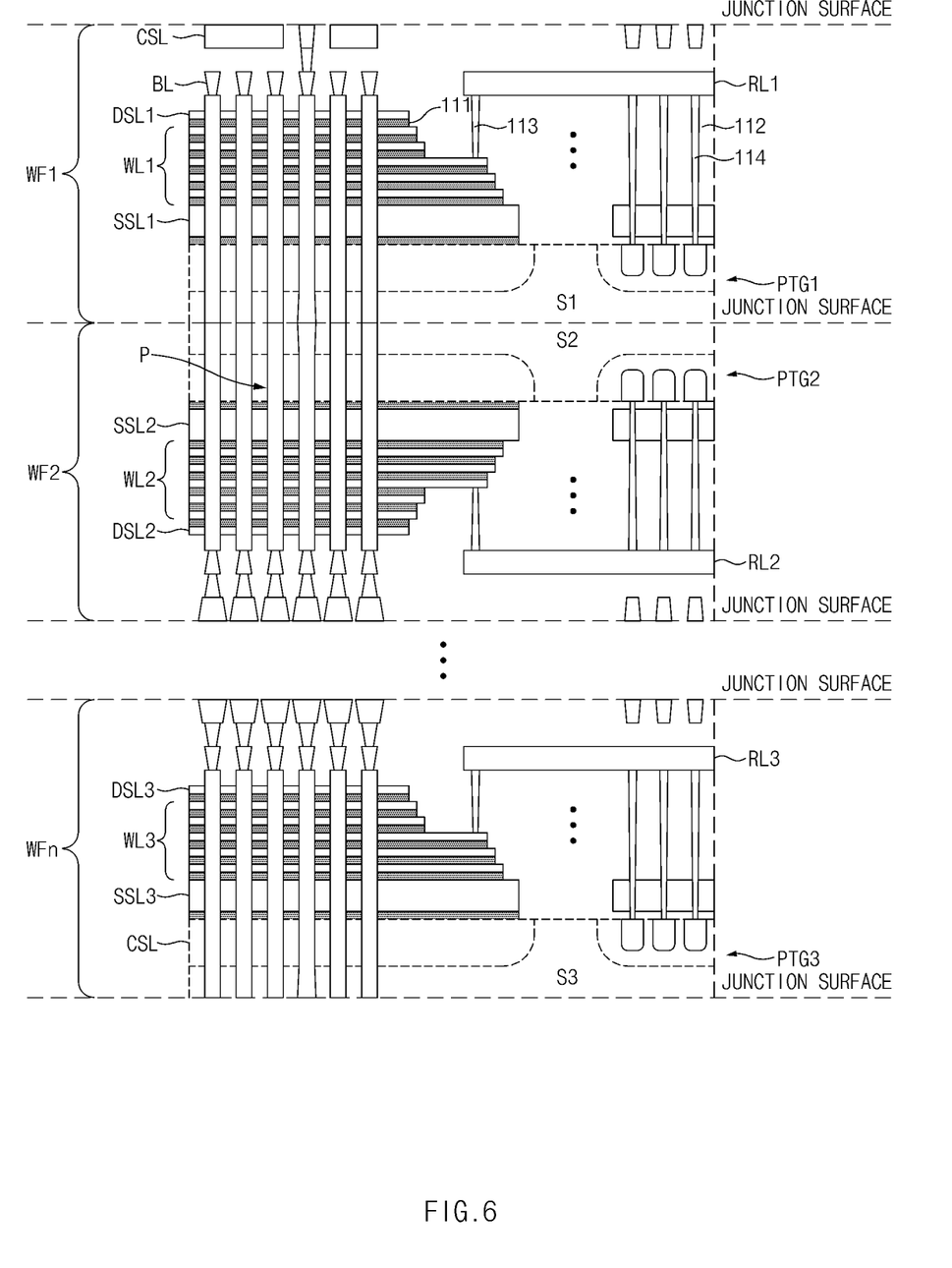

FIGS. 5 and 6 are cross-sectional views illustrating examples of substrate layers illustrated in FIGS. 3 and 4 in accordance with embodiments of the disclosure.

Referring to FIG. 5, a memory chip MC of semiconductor device 100 may include a stacked structure of substrate layers WF1~WFn. In substrate layers WF1~WFn, at least one cell string (CSTR) and a plurality of pass transistor groups PTG1~PTG3 may be formed respectively over substrates S1~S3. In more detail, in the substrate layer WF1, at least one cell string (CSTR) and the pass transistor group PTG1 may be formed over the substrate S1. In the substrate layer WFn-1, at least one cell string (CSTR) and the pass transistor group PTG2 may be formed over the substrate S2. In the substrate layer WFn, at least one cell string (CSTR) and the pass transistor group PTG3 may be formed over the substrate S3. Each of the substrates S1~S3 may include silicon (Si), germanium (Ge), or silicon germanium (SiGe). In addition, each of the substrates S1~S3 may be a polysilicon substrate, a Silicon On Insulator (SOI) substrate, or a Germanium-On-Insulator (GeOI) substrate. In each substrate layer, cell string (CSTR) may be coupled to a plurality of row lines RL1~RL3 through a plurality of contacts 113 formed in an interlayer insulation film 112. One or more contacts 114 may pass through the interlayer insulation film 112, such that one region (e.g., a source region) of each pass transistor group PTG1~PTG3 can be coupled to each row line RL1~RL3.

The substrate layer WF1 may include a source selection line SSL1 adjacent to the substrate S1, a predetermined number of word lines (WL1), and a drain selection line DSL1 coupled to the bit line (BL). The bit line (BL), the drain selection line DSL1, the word lines (WL1), and the source selection line SSL1 may be sequentially arranged in a vertical direction. The pass transistor group PTG1 coupled to the plurality of word lines (WL1) may be formed over the substrate S1. The plurality of word lines WL1 and the pass transistor group PTG1 may be coupled to each other through the plurality of row lines (RL1).

The substrate layer WFn-1 may include a source selection line SSL2 adjacent to the substrate S2, a predetermined number of word lines (WL2), and a drain selection line DSL2 coupled to the bit line (BL). The drain selection line DSL2, the word lines (WL2), and the source selection line SSL2 may be sequentially arranged in a vertical direction. The pass transistor group PTG2 coupled to the plurality of word lines (WL2) may be formed over the substrate S2. The plurality of word lines WL2 and the pass transistor group PTG2 may be coupled to each other through the plurality of row lines (RL2).

In addition, the substrate layer WFn may include a source selection line SSL3 adjacent to the substrate S3, a predetermined number of word lines (WL3), and a drain selection line DSL3 coupled to the bit line (BL). The drain selection line DSL3, the word lines (WL3), and the source selection line SSL3 may be sequentially arranged in a vertical direction. The pass transistor group PTG3 coupled to the plurality of word lines (WL3) may be formed over the substrate S3. The plurality of word lines WL3 and the pass transistor group PTG3 may be coupled to each other through the plurality of row lines (RL3).

The source selection lines SSL1~SSL3, the word lines WL1~WL3, and the drain selection lines DSL1~DSL3 respectively formed over the substrates S1~S3 may be separated from one another through insulation films 111.

In order to provide a plurality of pad areas in word lines WL1~WL3 for contacts 113, the substrate layers WF1~WFn may be designed so that the ends of stacked word lines WL1~WL3 coupled to contacts 113 are stepped. Put another way, the drain selection lines DSL1~DSL3, the word lines WL1~WL3 and the source selection lines SSL1~SSL3 are stacked to form a stepped shape or a pyramid shape in which the edge parts of the source selection lines SSL1~SSL3, the edge parts of the word lines WL1~WL3, and the edge parts of the drain selection lines DSL1~DSL3 are formed in stepped shapes to expose contact surfaces. That is, in a top or plan view, the word lines WL1~WL3, and the drain selection lines DSL1~DSL3 may be stacked in a specific shape in which the length of each word line (WL1~WL3), and each drain selection line (DSL1~DSL3) can be successively reduced relative to the ends of source selection lines (SSL1~SSL3) over each substrate (S1~S3). As described above, the above-mentioned region, in which the edge parts of the source selection lines SSL1~SSL3, the edge parts of the word lines WL1~WL3, and the edge parts of the drain selection lines DSL1~DSL3 are formed in stepped shapes and expose pad areas, will hereinafter be referred to as slim regions.

Each substrate layer WF1~WFn may include a vertical channel P that is installed upright and extending in a vertical direction on each substrate S1~S3 and electrically coupled to the bit line (BL). The vertical channel P may include polysilicon or monocrystalline silicon, and some regions of the vertical channel P may also include P-type impurities such as boron (B) as necessary.

A lower end of the vertical channel P may be electrically coupled to the common source line (CSL). An upper end of the vertical channel P may be electrically coupled to a bit line (BL) through a bit line contact (not shown). The memory chip MC may enable a cell current to flow through the vertical channel P of the cell string (CSTR) coupled between the bit line (BL) and the common source line (CSL).

Preferably, the number of the substrate layers WF1~WFn according to embodiments of the disclosed technology may be implemented as a predetermined number in a manner such that the vertical channel P (e.g., plug) can be etched at once.

As described above, the plurality of pass transistors may be distributed to the respective substrate layers WF1~WFn in a distributed manner, such that the region occupied by the row decoder 121 can be reduced in size.

Referring to FIG. 6, a memory chip MC of semiconductor device 100 according to an embodiment of the disclosed technology may include a stacked structure of mirrored substrate layers WF1~WFn. The memory chip MC may be designed in a manner so that the two substrate layers from among the substrate layers WF1~WFn (i.e., one pair of substrate layers) can be bonded to each other to form a mirrored structure. For example, the bottom surface of the substrate S1 of the substrate layer WF1 and the bottom surface of the substrate S2 of the substrate layer WF2 may be bonded to each other while being arranged to face each across a junction surface interposed between the bottom surface of the substrate S1 of the substrate layer WF1 and the bottom surface of the substrate S2 of the substrate layer WF2. In FIG. 6, the remaining constituent elements, other than the above-mentioned elements, are identical to those of FIG. 5, and as so redundant descriptions will be omitted here for brevity.

Figure 7:
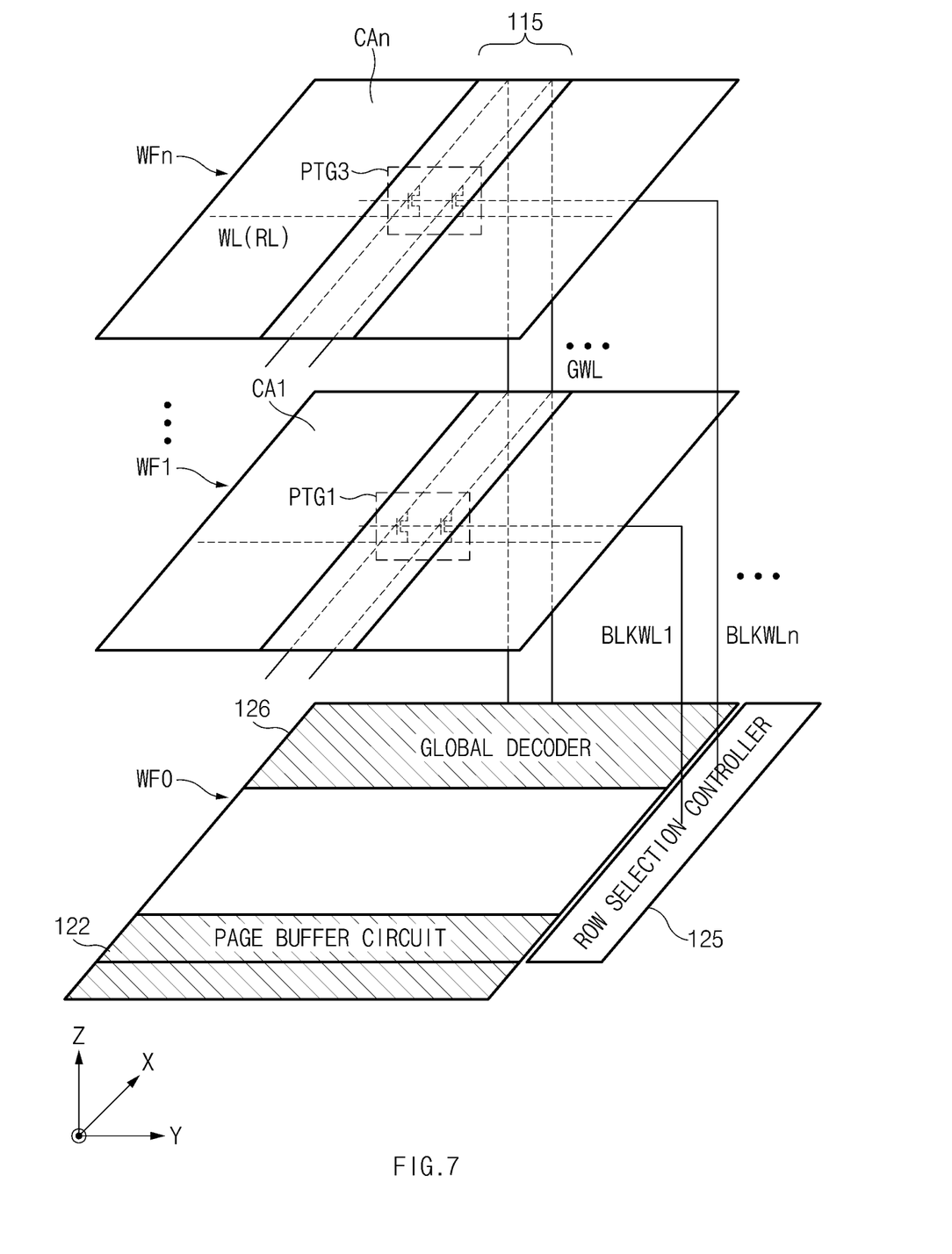
FIGS. 7 and 8 are schematic diagrams illustrating examples of stacked structures of semiconductor devices in accordance with embodiments of the disclosure.
Figure 8:
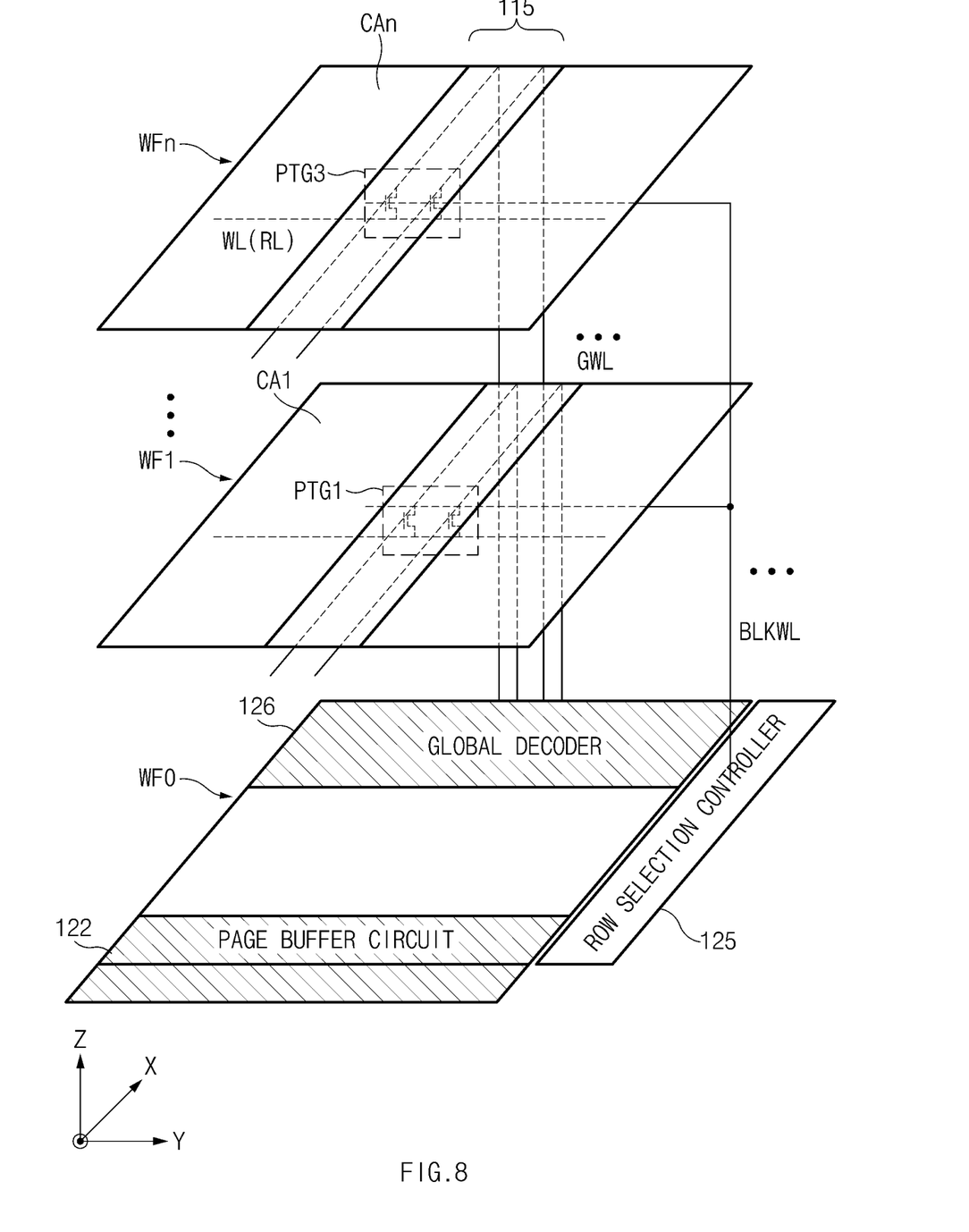

FIGS. 7 and 8 are schematic diagrams illustrating examples of stacked structures of semiconductor devices in accordance with embodiments of the disclosure. In FIG. 7, a third direction (Z) is a direction perpendicular to a horizontal plane formed to extend in each of a first direction (X) and a second direction (Y). For example, the third direction (Z) may be perpendicular to each of the first direction (X) and the second direction (Y).

Referring to FIG. 7, a plurality of substrate layers WF1~WFn may be sequentially stacked on the substrate layer WF0. That is, the plurality of substrate layers WF0~WFn may be vertically stacked in the third direction (Z).

The substrate layer WF0 may include a page buffer circuit 122, a row selection controller 125, and a global decoder 126. The page buffer circuit 122 may be disposed at one side of the substrate layer WF0 in the first direction (X). The global decoder 126 may be disposed at the other side of the substrate layer WF0 in the first direction (X). In addition, the row selection controller 125 may be disposed at one side of the substrate layer WF0 in the second direction (Y).

The substrate layers WF1~WFn may include sub-cell arrays CA1~CAn and a transfer circuit 115. That is, the transfer circuit 115 may be disposed in the respective substrate layers WF1~WFn in a distributed manner. The transfer circuit 115 may be disposed at the center region of each of the substrate layers WF1~WFn.

The transfer circuit 115 may provide a high voltage received from the global row line (GWL) to the sub-cell arrays CA1~CAn through pass transistor groups PTG1~PTG3.

The substrate layers WF1~WFn may be coupled to common global row lines (GWL). In other words, the plurality of substrate layers WF1~WFn may be formed to share the same global row line (GWL).

In addition, different row selection signals BLKWL1 to BLKWLn may be provided to the respective substrate layers WF1~WFn. In more detail, lines of the row selection signals BLKWL1 to BLKWLn corresponding to the respective substrate layers WF1~WFn can be isolated from each other.

In another embodiment, as shown in FIG. 8, each of substrate layers WF1~WFn may be coupled to the global row lines (GWL) isolated from each other. That is, the global row line (GWL) corresponding to the respective substrate layers WF1~WFn can be isolated from each other.

In addition, the same row selection signal (BLKWL) can be provided to the respective substrate layers WF1~WFn. That is, the substrate layers WF1~WFn may share the same row selection signal BLKWL. In the embodiment shown in FIG. 8, the same constituent elements as those of FIG. 7 are omitted here for convenience of description.

Figure 9:
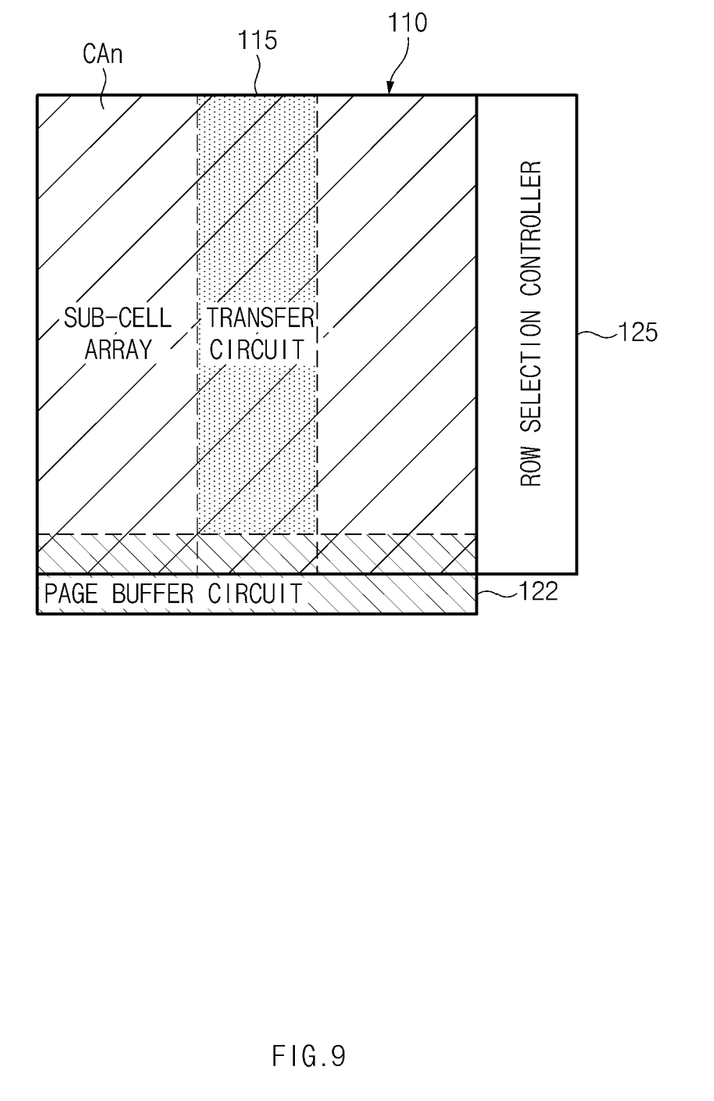
FIGS. 9 and 10 are schematic diagrams illustrating layout structures based on the stacked structures in FIGS. 7 and 8 in accordance with embodiments of the disclosure.
Figure 10:
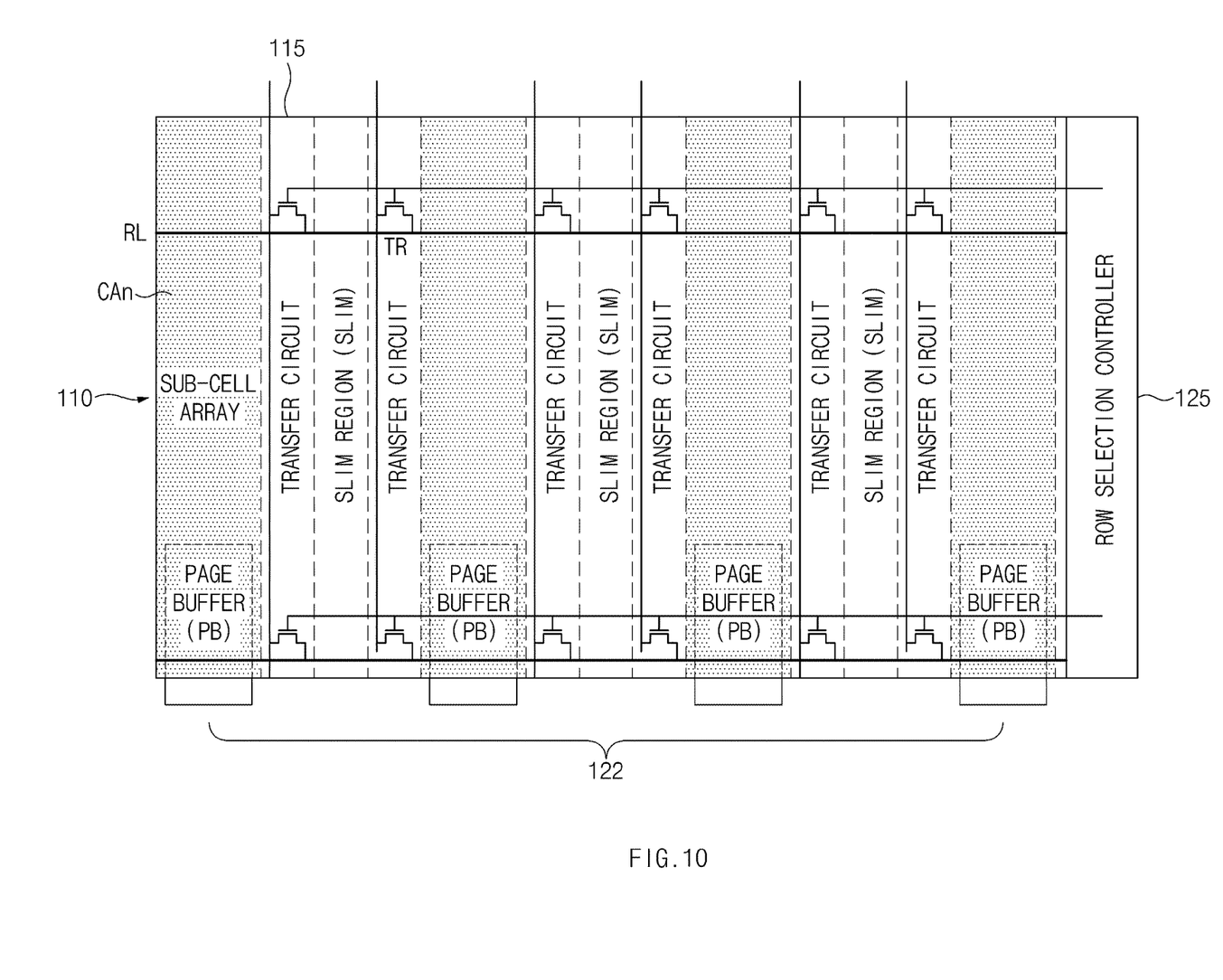

FIGS. 9 and 10 are schematic diagrams illustrating examples of layout structures based on the stacked structures in FIGS. 7 and 8 in accordance with embodiments of the disclosure. In more detail, FIGS. 9 and 10 illustrate the layout structures shown in FIGS. 7 and 8 when viewed from the third direction (Z).

Referring to FIG. 9, the page buffer circuit 122 may be disposed below the memory cell array 110. The transfer circuit 115 may be disposed below the sub-cell array CAn. The transfer circuit 115 may be disposed to overlap with the sub-cell array (CAn) in a vertical direction (Z). In other words, the pass transistor groups (PTG) of the transfer circuit 115 may be disposed below the sub-cell array (CAn) in the third direction (Z), in which direction the respective substrate layers WF1~WFn are stacked.

The page buffer circuit 122 may be disposed to partially overlap with the memory cell array 110 in the vertical direction (Z). In addition, the row selection controller 125 may be disposed at a side surface of the memory cell array 110.

In FIG. 10, the transfer circuit 115 may be located around the slim region (SLIM) of the sub-cell array (CAn). That is, the transfer circuit 115 may be disposed along the slim region (SLIM) of the sub-cell array (CAn). The pass transistors (TR) contained in the transfer circuit 115 may be distributed to both sides of the slim region (SLIM). A slim region (SLIM) may be defined by end portions of the row lines (RL) (i.e., word lines) in the memory cell array 110 that are etched in a stepped shape such that the etched row lines (RL) can be coupled to local word lines through one or more contacts.

The page buffer circuit 122 including each page buffer PB may be disposed at one side of the memory cell array 110. The page buffer (PB) may be disposed to partially overlap with the memory cell array 110 in a vertical direction (Z). The row selection controller 125 may be disposed at a side surface of the memory cell array 110.

As is apparent from the above description, the semiconductor device according to embodiments of the disclosed technology can reduce the number of pass transistors irrespective of the increasing number of stacks in a stacked structure, such that performance of a high-speed operation can be improved.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a first substrate layer including a logic circuit; and
   a plurality of second substrate layers stacked on the first substrate layer, the plurality of second substrate layers including a memory cell array,
   wherein each of the plurality of second substrate layers includes:
      a transfer circuit, coupled to a row line of the memory cell array, that is disposed over the second substrate layer and selectively coupled to a global row line.

2. The semiconductor device according to claim 1, wherein the logic circuit includes:
   a row selection controller configured to generate a row selection signal in response to a row control signal;
   a global decoder configured to provide an operation voltage through the global row line; and
   a peripheral circuit configured to generate the row control signal.

3. The semiconductor device according to claim 1, wherein the logic circuit further includes:
   a page buffer circuit coupled to a bit line of the memory cell array and configured to control operations of the memory cell array.

4. The semiconductor device according to claim 1, wherein the plurality of second substrate layers share the global row line.

5. The semiconductor device according to claim 2, wherein the plurality of second substrate layers share the row selection signal.

6. The semiconductor device according to claim 2, wherein the transfer circuit includes:
   a plurality of pass transistor groups each having a plurality of pass transistors and respectively distributed to the plurality of second substrate layers, with each of the plurality of pass transistor groups coupled between the global row line and the row line to receive the row selection signal through gate terminals of the plurality of pass transistors.

7. The semiconductor device according to claim 6, wherein each of the plurality of pass transistors of one pass transistor group corresponds to one of a plurality of row sub-lines in the row lines of a corresponding second substrate layer.

8. The semiconductor device according to claim 6, wherein the memory cell array includes:
a plurality of sub-cell arrays, each of the plurality of sub-cell arrays corresponding to one of the plurality of second substrate layers on a one to one basis.

9. The semiconductor device according to claim 8, wherein the plurality of sub-cell arrays is disposed to correspond to the plurality of pass transistor groups on a one to one basis.

10. The semiconductor device according to claim 9, wherein:
a number of the plurality of pass transistors contained in each of the plurality of pass transistor groups is identical to a number of row sub-lines in a corresponding row lines.

11. The semiconductor device according to claim 10, wherein each of the plurality of pass transistor groups is disposed below a corresponding one of the plurality of sub-cell arrays in a direction along which the first substrate layer and the second substrate layer are stacked.

12. The semiconductor device according to claim 11, wherein, the plurality of pass transistor groups are disposed in a direction of slim regions of the plurality of sub-cell arrays.

13. The semiconductor device according to claim 1, wherein at least two of the plurality of second substrate layers are bonded to each other through a plurality of pads at a junction surface therebetween and are mirrored with respect to each other.

14. The semiconductor device according to claim 1, wherein:
the memory cell array includes a plurality of sub-cell arrays,
wherein each of the plurality of sub-cell arrays includes a corresponding sub-cell string.

15. The semiconductor device according to claim 14, wherein a plurality of sub-cell strings is electrically coupled to each other through a through silicon via and a vertical channel that pass through the plurality of second substrate layers, and the plurality of sub-cell strings constitute one cell string structure formed between a common source line and a bit line.

16. The semiconductor device according to claim 15, wherein:
an erase operation is controlled in unit of a block corresponding to one sub-cell string.

17. The semiconductor device according to claim 1, wherein the row line includes a source selection line, a plurality of word lines, and a drain selection line.

18. The semiconductor device according to claim 17, wherein:
during any one of a read operation and a program operation of the memory cell array,
the source selection line, the plurality of word lines, and the drain selection line are activated in the plurality of second substrate layers.

19. The semiconductor device according to claim 17, wherein:
during an erase operation of the memory cell array,
the source selection line and the drain selection line in the plurality of second substrate layers are separately controlled according to the respective second substrate layers.

20. A semiconductor device comprising:
a first substrate layer including a logic circuit;
a plurality of second substrate layers, stacked on the first substrate layer, each including a first sub-cell array and a first pass transistor group; and
a third substrate layer, stacked on the plurality of second substrate layers, including a second sub-cell array and a second pass transistor group.

21. The semiconductor device according to claim 20, wherein the first to third substrate layers are bonded to each other through a plurality of pads at junction surfaces.

22. The semiconductor device according to claim 20, wherein:
the first sub-cell array includes a first sub-cell string and the second sub-cell array includes a second sub-cell string,
wherein the first sub-cell string and the second sub-cell string are electrically coupled to each other through a silicon via and a vertical channel passing through the second substrate layer.

* * * * *